United States Patent
Kuo et al.

(10) Patent No.: US 9,747,975 B2
(45) Date of Patent: Aug. 29, 2017

(54) MULTI-LEVEL PHASE CHANGE MEMORY

(75) Inventors: Charles C. Kuo, Union City, CA (US); Ilya V. Karpov, Santa Clara, CA (US)

(73) Assignee: Ovonyx Memory Technology, LLC, Alexandria, VA (US)

(*) Notice: Subject to any disclaimer, the term of this patent is extended or adjusted under 35 U.S.C. 154(b) by 422 days.

(21) Appl. No.: 13/028,306

(22) Filed: Feb. 16, 2011

(65) Prior Publication Data

US 2011/0136315 A1 Jun. 9, 2011

Related U.S. Application Data

(62) Division of application No. 11/127,482, filed on May 12, 2005, now Pat. No. 7,910,904.

(51) Int. Cl.
*H01L 45/00* (2006.01)
*G11C 11/56* (2006.01)
*G11C 13/00* (2006.01)
*H01L 27/24* (2006.01)

(52) U.S. Cl.
CPC ...... *G11C 11/5678* (2013.01); *G11C 13/0004* (2013.01); *H01L 27/2427* (2013.01); *H01L 45/06* (2013.01); *H01L 45/126* (2013.01); *H01L 45/1233* (2013.01); *H01L 45/141* (2013.01); *H01L 45/1683* (2013.01)

(58) Field of Classification Search
CPC H01L 45/1683; H01L 45/126; H01L 45/1233
See application file for complete search history.

(56) References Cited

U.S. PATENT DOCUMENTS

| | | | |
|---|---|---|---|
| 6,815,704 B1 * | 11/2004 | Chen | 257/2 |
| 2003/0116794 A1 * | 6/2003 | Lowrey | 257/296 |
| 2004/0251551 A1 * | 12/2004 | Hideki | 257/758 |

* cited by examiner

*Primary Examiner* — Amar Movva
(74) *Attorney, Agent, or Firm* — Kevin L. Bray

(57) ABSTRACT

A phase change memory may be formed which is amenable to multilevel programming. The phase change material may be formed with a lateral extent which does not exceed the lateral extent of an underlying heater. As a result, the possibility of current bypassing the amorphous phase change material in the reset state is reduced, reducing the programming current that is necessary to prevent this situation. In addition, a more controllable multilevel phase change memory may be formed in some embodiments.

13 Claims, 5 Drawing Sheets

MULTI-LEVEL PHASE CHANGE MEMORY

CROSS-REFERENCE TO RELATED APPLICATIONS

This application is a divisional of U.S. patent application Ser. No. 11/127,482, filed on May 12, 2005.

BACKGROUND

This invention relates generally to phase change memories.

Phase change memory devices use phase change materials, i.e., materials that may be electrically switched between a generally amorphous and a generally crystalline state, for electronic memory applications. One type of memory element utilizes a phase change material that may be, in one application, electrically switched between a generally amorphous structural state and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

Conventional phase change memories require programming currents to convert the phase change memories between the different states. Desirably, these programming currents are kept as small as possible in order to reduce power consumption. Generally, a heater is positioned under a phase change material and the current through the heater is responsible for changing the state of at least an overlying volume of the phase change material. Unless considerable current is provided to convert a substantial region of the overlying chalcogenide, the converted region of reset or amorphous phase change material may be insufficient to prevent some current from passing past the converted material. The current flow at a small read voltage may be interpreted electrically as a low resistance state even though the region directly above the heater is amorphous. When a higher current is used to create a larger heated mushroom, the phase change material along these potential leakage paths is converted from crystalline to amorphous, allowing the cell to reach a completely reset state, but at the expense of considerable current consumption.

In addition, the transition from the set to the reset electrical state is fairly abrupt because the chalcogenide regions adjacent the heater periphery must be completed converted into a reset state to effect a large increase in the measured cell resistance. If these regions are not completely converted, then a low resistance state can still be read electrically. When these regions are entirely converted, a measured cell resistance climbs quickly to the reset resistance. This makes it challenging to adopt a multilevel programming technique since small changes in current can result in large and varying increments in cell resistance, depending on the amount of chalcogenide material which is converted at the heater periphery.

Thus, there is a need for better phase change memories for implementing multilevel programming.

DETAILED DESCRIPTION

Figure 1:
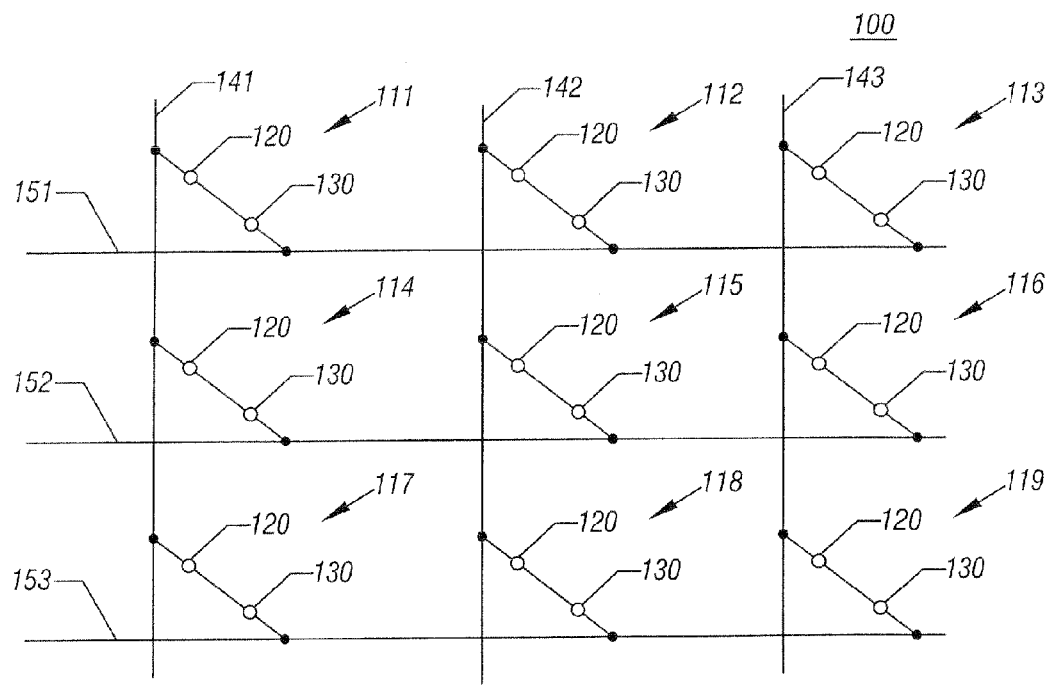
FIG. 1 is a schematic diagram illustrating a memory in accordance with one embodiment of the present invention.

Turning to FIG. 1, an embodiment of a memory 100 is illustrated. Memory 100 may include a 3×3 array of memory cells 111-119, wherein memory cells 111-119 each include a select device 120 and a memory element 130. Although a 3×3 array is illustrated in FIG. 1, the scope of the present invention is not limited in this respect. Memory 100 may have a larger array of memory cells.

In one embodiment, memory elements 130 may comprise a phase change material. In this embodiment, memory 100 may be referred to as a phase change memory. A phase change material may be a material having electrical properties (e.g. resistance, capacitance, etc.) that may be changed through the application of energy such as, for example, heat, light, voltage potential, or electrical current. Examples of a phase change material may include a chalcogenide material.

A chalcogenide alloy may be used in a memory element or in an electronic switch. A chalcogenide material may be a material that includes at least one element from column VI of the periodic table or may be a material that includes one or more of the chalcogen elements, e.g., any of the elements of tellurium, sulfur, or selenium.

Memory 100 may include column lines 141-143 and row lines 151-153 to select a particular memory cell of the array during a write or read operation. Column lines 141-143 and row lines 151-153 may also be referred to as address lines since these lines may be used to address memory cells 111-119 during programming or reading. Column lines 141-143 may also be referred to as bit lines and row lines 151-153 may also be referred to as word lines.

Memory elements 130 may be connected to row lines 151-153 and may be coupled to column lines 141-143 via select device 120. While one select device 120 is depicted, more select devices may also be used. Therefore, when a particular memory cell (e.g., memory cell 115) is selected, voltage potentials may be applied to the memory cell's associated column line (e.g., 142) and row line (e.g., 152) to apply a voltage potential across the memory cell.

Series connected select device 120 may be used to access memory element 130 during programming or reading of memory element 130. The select device 120 may be an ovonic threshold switch that can be made of a chalcogenide alloy that does not exhibit an amorphous to crystalline phase change and which undergoes rapid, electric field initiated change in electrical conductivity that persists only so long as a holding voltage is present. Select device 120 may operate as a switch that is either "off" or "on" depending on the amount of voltage potential applied across the memory cell, and more particularly whether the current through the select device exceeds its threshold current or voltage, which then triggers the device into the on state. The off state may be a substantially electrically nonconductive state and the on state may be a substantially conductive state, with less resistance than the off state. In the on state, the voltage across the select device is equal to its holding voltage $V_H$ plus I×Ron, where Ron is the dynamic resistance from $V_H$. For example, select device 120 may have a threshold voltage and, if a voltage potential less than the threshold voltage of a select device 120 is applied across select device 120, then at least one select device 120 may remain "off" or in a relatively high resistive state so that little or no electrical current passes through the memory cell and most of the voltage drop from selected row to selected column is across the select device. Alternatively, if a voltage potential greater than the threshold voltage of select device 120 is applied across select device 120, then the select device 120 may "turn on," i.e., operate in a relatively low resistive state so that electrical current passes through the memory cell. In other words, select device 120 may be in a substantially electrically nonconductive state if less than a predetermined voltage potential, e.g., the threshold voltage, is applied across select device 120. Select device 120 may be in a substantially conductive state if greater than the predetermined voltage potential is applied across select device 120. Select device 120 may also be referred to as an access device, an isolation device, or a switch.

In one embodiment, each select device 120 may comprise a switching material such as, for example, a chalcogenide alloy, and may be referred to as an ovonic threshold switch, or simply an ovonic switch. The switching material of select device 120 may be a material in a substantially amorphous state positioned between two electrodes that may be repeatedly and reversibly switched between a higher resistance "off" state (e.g., greater than about ten megaOhms) and a relatively lower resistance "on" state (e.g., about one thousand Ohms in series with $V_H$) by application of a predetermined electrical current or voltage potential. In this embodiment, each select device 120 may be a two terminal device that may have a current-voltage (I-V) characteristic similar to a phase change memory element that is in the amorphous state. However, unlike a phase change memory element, the switching material of select device 120 may not change phase. That is, the switching material of select device 120 may not be a programmable material, and, as a result, select device 120 may not be a memory device capable of storing information. For example, the switching material of select device 120 may remain permanently amorphous and the I-V characteristic may remain the same throughout the operating life. A representative example of I-V characteristics of select device 120 is shown in FIG. 2.

Figure 2:
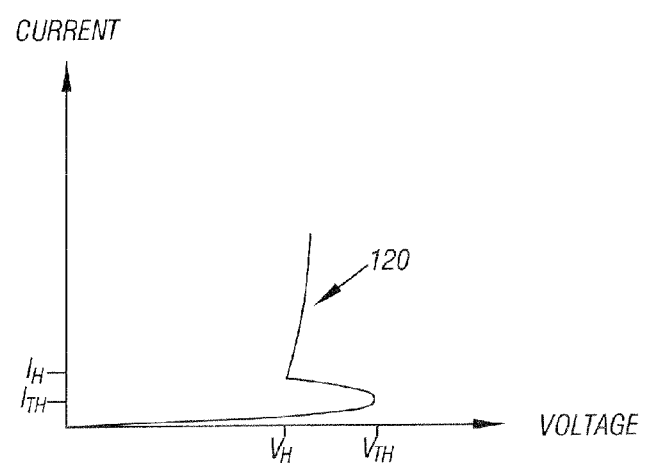
FIG. 2 is a diagram illustrating a current-voltage characteristic of an access device.

Turning to FIG. 2, in the low voltage or low electric field mode, i.e., where the voltage applied across select device 120 is less than a threshold voltage (labeled $V_{TH}$), select device 120 may be "off" or nonconducting, and exhibit a relatively high resistance, e.g., greater than about 10 megaOhms. Select device 120 may remain in the off state until a sufficient voltage, e.g., $V_{TH}$, is applied, or a sufficient current is applied, e.g., $I_{TH}$, that may switch select device 120 to a conductive, relatively low resistance on state. After a voltage potential of greater than about $V_{TH}$ is applied across select device 120, the voltage potential across select device 120 may drop ("snapback") to a holding voltage potential, labeled $V_H$. Snapback may refer to the voltage difference between $V_{TH}$ and $V_H$ of a select device.

In the on state, the voltage potential across select device 120 may remain close to the holding voltage of $V_H$ as current passing through select device 120 is increased. Select device 120 may remain on until the current through select device 120 drops below a holding current, labeled $I_H$. Below this value, select device 120 may turn off and return to a relatively high resistance, nonconductive off state until the $V_{TH}$ and $I_{TH}$ are exceeded again.

Figure 3:
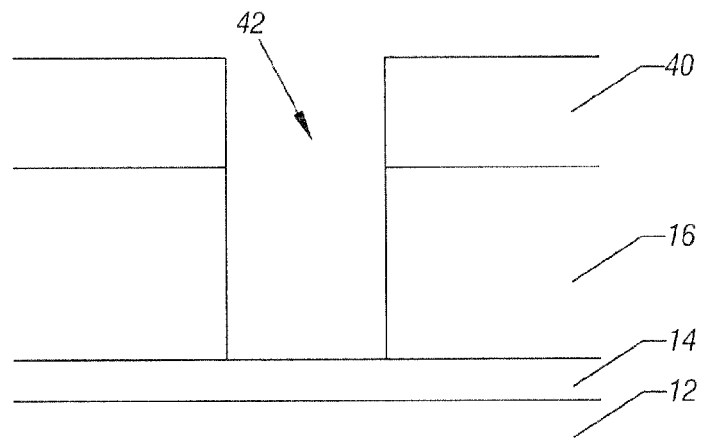
FIG. 3 is an enlarged cross-sectional view of the embodiment shown in FIG. 1 at an early stage of manufacture in accordance with one embodiment of the present invention.

Referring to FIG. 3, a phase change memory cell, such as a cell 111-119 in FIG. 1, may be formed in a substrate 10. Over the substrate 10 may be formed various interconnections and transistor features. An interlayer dielectric 12 separates those features from the features provided above the interlayer dielectric 12. Above the interlayer dielectric 12 is a conductor 14 which may act as a row line 151-153 (FIG. 1) in accordance with one embodiment of a memory in which the memory cells are arranged in rows and columns. A first dielectric layer 16 having one etching characteristic may be covered by a second dielectric layer 40 having a second (different) etching characteristics so that the layer 16 may also function as an etch stop layer.

Figure 4:
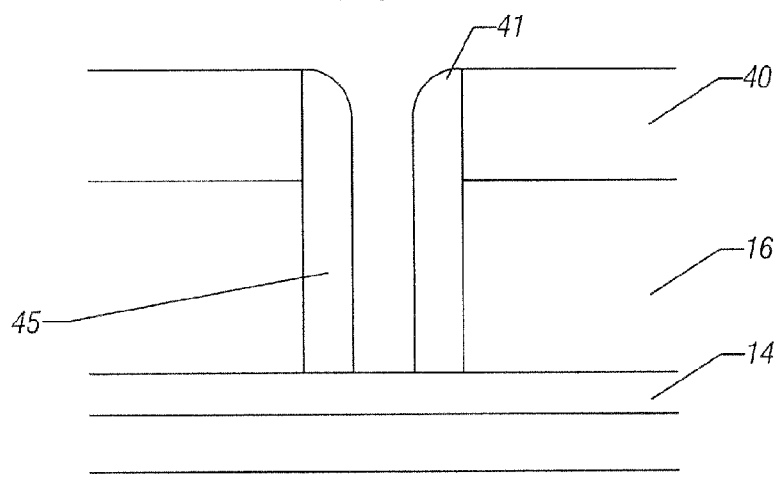
FIG. 4 is an enlarged cross-sectional view of the embodiment shown in FIG. 3 at a subsequent stage of manufacture in accordance with one embodiment of the present invention.
Figure 5:
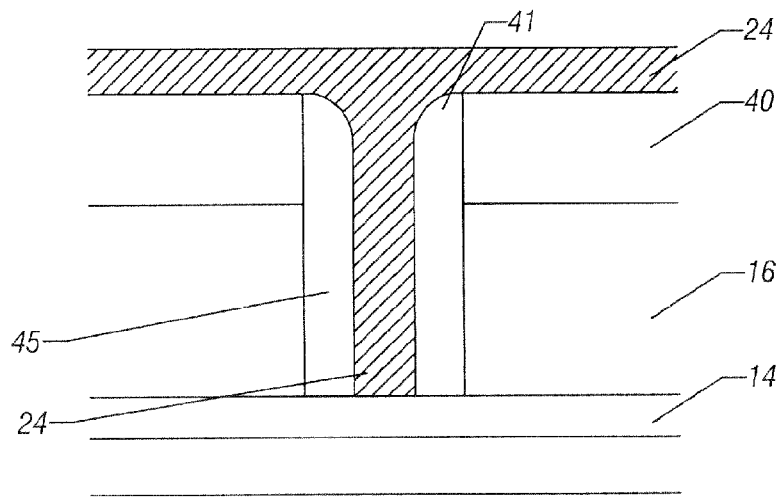
FIG. 5 is an enlarged cross-sectional view of the embodiment shown in FIG. 4 at a subsequent stage of manufacture in accordance with one embodiment of the present invention.

A sidewall spacer 45 may be formed by conventional techniques, including the deposition of a layer of nitride followed by anisotropic etching, resulting in the structure shown in FIG. 4. Then, a heater 24 may be deposited to overfill the pore 42 as shown in FIG. 5. The heater 24 may, for example, be titanium nitride, as one example.

Figure 6:
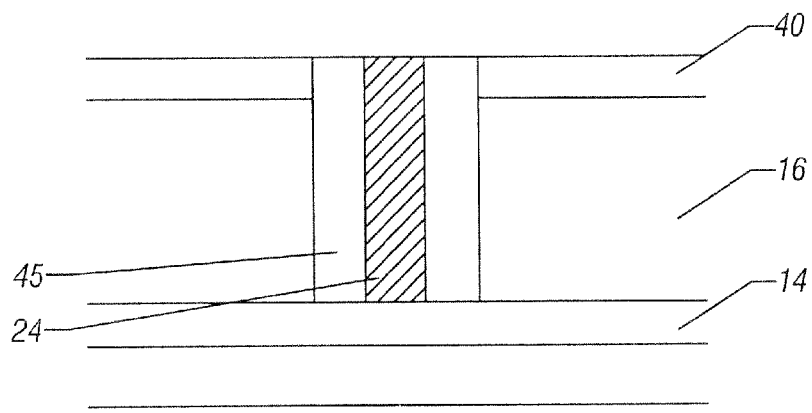
FIG. 6 is an enlarged cross-sectional view of the embodiment shown in FIG. 5 at a subsequent stage of manufacture in accordance with one embodiment of the present invention.

This structure is then planarized in a timed polish so that a portion of the layer 40 remains, but the flared region 41 of the spacer 22 may be polished away, in one embodiment, as shown in FIG. 6.

Figure 7:
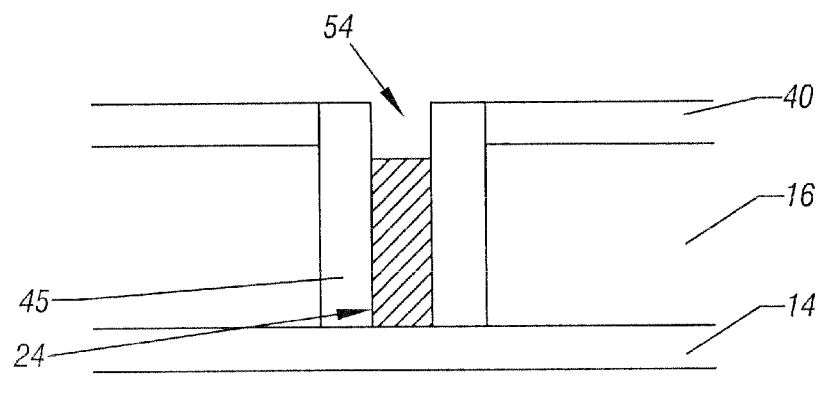
FIG. 7 is an enlarged cross-sectional view of the embodiment shown in FIG. 6 at a subsequent stage of manufacture in accordance with one embodiment of the present invention.

Referring to FIG. 7, the heater 24 may then be dipped back to produce a gap or pore 54. The dipping back may be done using a dry or a wet etch process. However, it is advantageously a selective removal process such that the heater material 24 is removed without damaging the sidewall spacer 45 or the dielectric layer 40 to the greatest possible extent. In the case where the heater is titanium silicon nitride and the layer 40 is formed of an oxide, a concentrated hydrosulfuric acid with hydrogen peroxide may be utilized. The depth of the pore 54, in some embodiments, may be less than 750 Angstroms and, in one particular embodiment, about 600 Angstroms.

Figure 8:
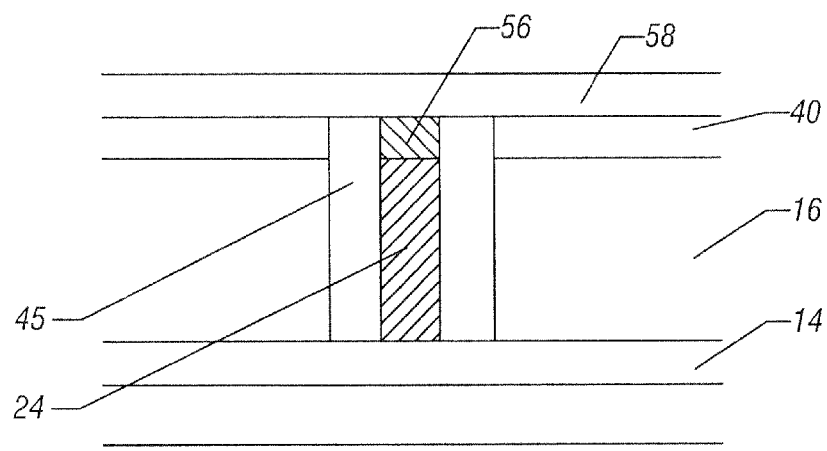
FIG. 8 is an enlarged cross-sectional view of the embodiment shown in FIG. 7 at a subsequent stage of manufacture in accordance with one embodiment of the present invention.

Referring to FIG. 8, a chalcogenide material 56 may be deposited in the pore 56 and over the dielectric layer 40. Then, the chalcogenide material 56 may be planarized so that it is entirely within the pore 54 defined by the sidewall spacers 45 and has a height of less than 750 Angstroms in some embodiments. Thereafter, an electrode 58 may be deposited, as indicated in FIG. 8, and, if desired, patterned.

An the ovonic threshold switch 120 (FIG. 1) is then formed over the memory element 130. An electrode may be deposited, followed by the deposition of a chalcogenide material that does not change phase, in turn followed by an upper electrode. The sandwich of the upper electrode, chalcogenide material, and lower electrode may then be patterned.

Chalcogenide layer 56 may be a phase change, programmable material capable of being programmed into one of at least three memory states by applying a current to layer 56 to alter the phase of material between a substantially crystalline state and a substantially amorphous state, wherein a resistance of material in various amorphous states is greater than the resistance of switching material 56 in the substantially crystalline state.

Programming of the material to alter the state or phase of the material may be accomplished by applying voltage potentials to the row and column and thereby generating a voltage potential across memory element 130. When the voltage potential is greater than the threshold voltage of select device 120 and memory element 130, then an electrical current may flow through layer 56 in response to the applied voltage potential, and may result in heating of layer 56.

This heating may alter the memory state or phase of layer 56. Altering the phase or state of memory layer 56 may alter the electrical characteristic of material, e.g., the resistance of the material may be altered by altering the phase of the memory material.

In the "reset" state, layer 56 may be in an amorphous or semi-amorphous state and in the "set" state, the layer 56 may be in an a crystalline or semi-crystalline state. The resistance of layer 56 in the amorphous or semi-amorphous states may be greater than its resistance in the crystalline or semi-crystalline state. It is to be appreciated that the association of reset and set with amorphous and crystalline states, respectively, is a convention and that at least an opposite convention may be adopted.

Using electrical current, layer 56 may be heated to a relatively higher temperature to amorphosize layer 56 and "reset" layer 56 (e.g., program it to a logic "0" value). Heating the volume of the layer 56 to a relatively lower crystallization temperature may crystallize memory material and "set" memory material (e.g., program memory material to a logic "1" value). Various resistances of memory material may be achieved to store information by varying the amount of current flow and duration through the volume of the layer 56.

Although the scope of the present invention is not limited in this respect, in one example, the composition of switching material for the ovonic threshold switch 120 may comprise a Si concentration of about 14%, a Te concentration of about 39%, an As concentration of about 37%, a Ge concentration of about 9%, and an In concentration of about 1%. In another example, the composition of switching material 56 may comprise a Si concentration of about 14%, a Te concentration of about 39%, an As concentration of about 37%, a Ge concentration of about 9%, and a P concentration of about 1%. In these examples, the percentages are atomic percentages which total 100% of the atoms of the constituent elements.

In another embodiment, a composition for the layer 56 may include an alloy of arsenic (As), tellurium (Te), sulfur (S), germanium (Ge), selenium (Se), and antimony (Sb) with respective atomic percentages of 10%, 21%, 2%, 15%, 50%, and 2%.

Although the scope of the present invention is not limited in this respect, in other embodiments, the layer 56 for the ovonic threshold switch may include Si, Te, As, Ge, sulfur (S), and selenium (Se). As an example, the composition of switching material 32 may comprise a Si concentration of about 5%, a Te concentration of about 34%, an As concentration of about 28%, a Ge concentration of about 11%, a S concentration of about 21%, and a Se concentration of about 1%.

Suitable materials for electrodes 14 and 58 may include a thin film of titanium (Ti), titanium nitride (TiN), titanium tungsten (TiW), carbon (C), silicon carbide (SiC), titanium aluminum nitride (TiAlN), titanium silicon nitride (TiSiN), polycrystalline silicon, tantalum nitride (TaN), some combination of these films, or other suitable conductors or resistive conductors compatible with switching material 56.

Figure 9:
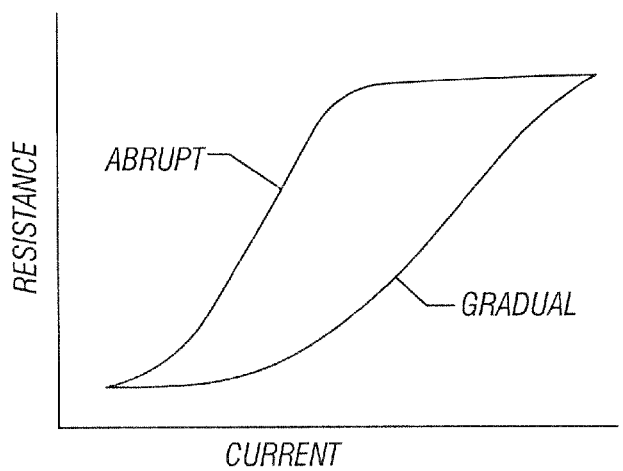
FIG. 9 is a hypothetical set of resistance current curves.

Referring to FIG. 9, hypothetical curves for resistance versus current are illustrated for two different phase change memories. The curve on the left, labeled "abrupt," has an abrupt transition from a low to a high resistance. While it has suitable plateaus at its low and high resistances, it is most suitable for a memory having only two memory states, programmed or unprogrammed, an amorphous and crystalline.

Conversely, the memory on the right labeled "gradual" has a gradual transition between its lowest and highest resistances as current increases. This arrangement is more amenable to a multilevel memory since, in addition to an amorphous and a crystalline state, intermediate states may be repeatedly established as well.

The configuration of the chalcogenide material 56, shown in FIG. 8, enables a less abrupt and more gradual transition between crystalline and amorphous states, enabling the programming of intermediate states between the amorphous and crystalline states. This is in part due to the fact that considerable current is not necessary to convert the relatively small amount of chalcogenide material 56. The material is of relatively small volume and thereby may be relatively completely converted. Current bypass of the converted material is unlikely. Thus, the current flow at small read voltages may be interpreted electrically in a correct fashion. Since there are no chalcogenide regions adjacent the heater periphery, there is no need to be sure that these are completely converted into a reset state. Therefore, it is not necessary to have an abrupt transition to the reset state.

Figure 10:
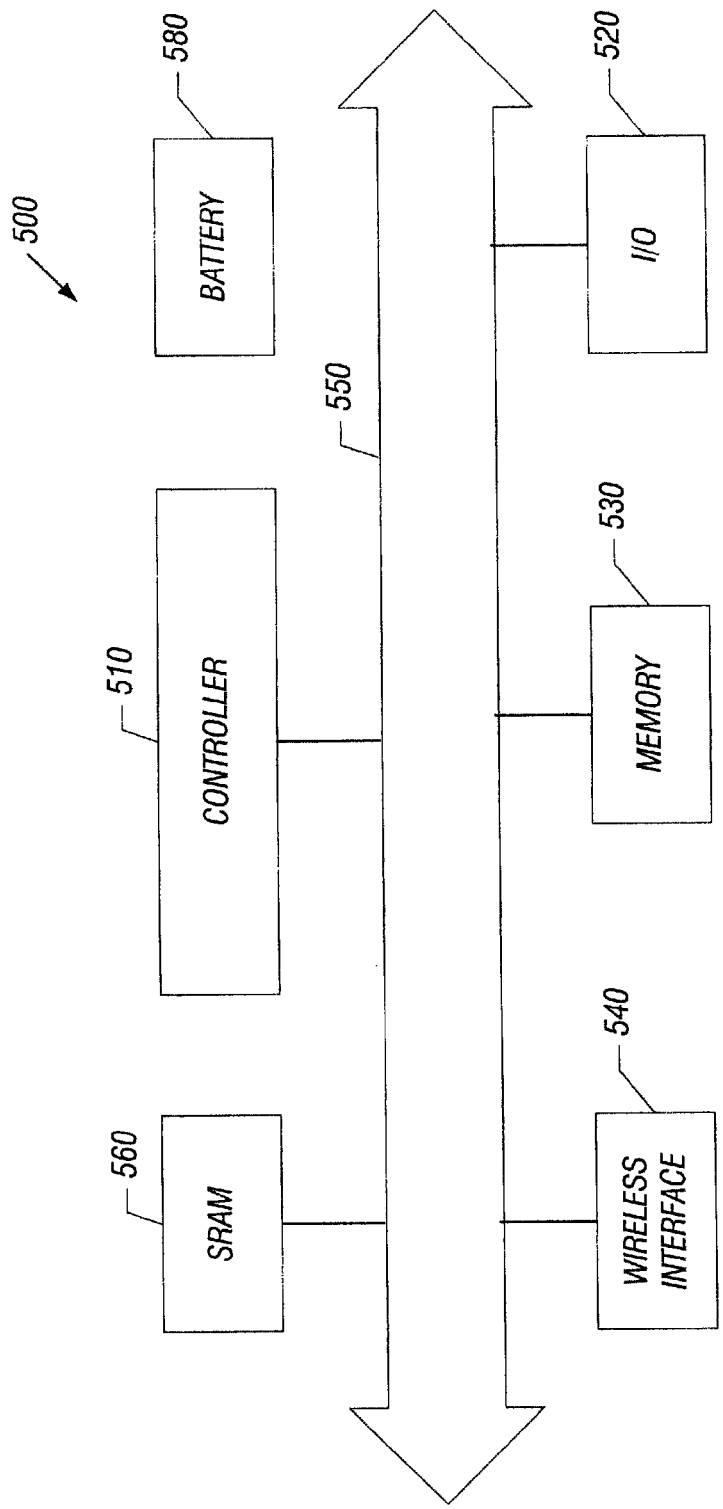
FIG. 10 is a schematic system depiction of one embodiment of the present invention.

Turning to FIG. 10, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g. a keypad, display), a memory 530, a static random access memory (SRAM) 560, battery 580, and a wireless interface 540 coupled to each other via a bus 550. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory 100 discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

As a result of the confined arrangement between the heater 24 and the layer 56, there is no need for the provision of extra current creating a mushroom over the heater to prevent current from bypassing the amorphous region of a reset bit. Because of the constraining sidewall spacers, including the spacers 54 which line up with the spacers 45, the region of the layer 56 over the heater 24 is completely converted. Thus, in some embodiments, current consumption may be reduced which may be particularly advantageous in mobile applications. Moreover, the situation where the overlying region of the layer 56 on the heater 24 is not completely converted such that a low resistance state can be read but the measured cell resistance climbs quickly to the reset state. This creates an abrupt transition since small changes in current can result in large and varying increments of cell resistance. Thus, in some embodiments, a more controllable phase change memory that assumes multiple levels can be created.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   forming a pore in a dielectric material, said dielectric material including a first dielectric layer and a second dielectric layer, said first dielectric layer surrounding a first portion of said pore and said second dielectric layer surrounding a second portion of said pore;
   forming a sidewall spacer in said pore, said sidewall spacer defining an opening in said pore, said opening including a first portion surrounded by a first portion of said sidewall layer and a second portion surrounded by a second portion of said sidewall layer, said first portion of said sidewall layer being surrounded by said first dielectric layer and said second portion of said sidewall layer being surrounded by said second dielectric layer;
   depositing a heater material in said opening; and
   removing a portion of said heater material from said opening, said removing recessing said heater material in said opening.

2. The method of claim 1, further comprising forming a chalcogenide material on said recessed heater material.

3. The method of claim 2, further comprising planarizing said chalcogenide material.

4. The method of claim 2, wherein said forming sidewall spacer includes depositing a sidewall spacer material in said pore, said method further comprising planarizing said sidewall spacer material.

5. The method of claim 2, wherein said chalcogenide material does not extend beyond said opening.

6. The method of claim 1, wherein said depositing heater material includes planarizing said heater material.

7. The method of claim 1, wherein said removing includes removing said heater material from said first portion of said opening.

8. The method of claim 7, wherein said removing removes none of said heater material from said second portion of said opening.

9. The method of claim 7, further comprising forming a chalcogenide material on said heater material.

10. The method of claim 9, wherein said chalcogenide material completely fills said first portion of said opening.

11. The method of claim 9, wherein said chalcogenide material does not extend beyond said opening.

12. The method of claim 9, wherein said chalcogenide material does not extend beyond said first portion of said opening.

13. The method of claim 1, wherein said heater material completely fills said second portion of said opening.

* * * * *